United States Patent
Bielmeier et al.

(10) Patent No.: US 7,340,225 B2
(45) Date of Patent: Mar. 4, 2008

(54) METHOD FOR MONITORING AN RF POWER AMPLIFIER, AND AN RF DEVICE, A MONITORING DEVICE, AND AN MR SYSTEM CORRESPONDING THERETO

(75) Inventors: Wolfgang Bielmeier, Nürnberg (DE); Klaus Ludwig, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 477 days.

(21) Appl. No.: 11/055,754

(22) Filed: Feb. 10, 2005

(65) Prior Publication Data
US 2005/0197077 A1    Sep. 8, 2005

(30) Foreign Application Priority Data
Feb. 10, 2004  (DE) .................... 10 2004 006 552

(51) Int. Cl.
*H04B 17/00* (2006.01)
*H04B 1/04* (2006.01)

(52) U.S. Cl. ................ 455/115.1; 455/67.11; 455/114.3

(58) Field of Classification Search ............ 455/115.1, 455/67.11, 67.13, 296, 310, 501, 311, 341, 455/114.3; 324/307, 309, 314
See application file for complete search history.

(56) References Cited

U.S. PATENT DOCUMENTS

| | | | |
|---|---|---|---|
| 6,426,623 B1 * | 7/2002 | Bernstein | 324/314 |
| 6,683,453 B2 * | 1/2004 | Heid | 324/307 |
| 6,841,997 B2 * | 1/2005 | Feiweier | 324/307 |
| 6,891,373 B2 * | 5/2005 | Deimling | 324/309 |
| 7,254,435 B2 * | 8/2007 | Zhang et al. | 600/410 |
| 2005/0165295 A1 * | 7/2005 | Li et al. | 600/410 |
| 2005/0260955 A1 * | 11/2005 | Bielmeier et al. | 455/115.1 |

* cited by examiner

*Primary Examiner*—Sonny Trinh
(74) *Attorney, Agent, or Firm*—Schiff Hardin LLP

(57) ABSTRACT

In a method for monitoring of a radio frequency power amplifier and a radio frequency device, a radio frequency monitoring device and magnetic resonance tomography system operable according to the method, radio frequency pulses emitted by a radio frequency power amplifier and are transmitted into a human subject by a transmission coil at temporal intervals. Measurement values that represent the power of the radio frequency pulses are measured at temporal intervals, and varying, predetermined power limit values are determined at temporal intervals. A control value representing the radio frequency dose emitted in a time window is determined based on a number of measurement values measured in the time window. Likewise, a limit control value representing a dose limit value allowed in the appertaining time window is determined based on the power limit values determined in the appertaining time window. The radio frequency power amplifier is limited in operation if and when the control value reaches or exceeds the limit control value.

24 Claims, 4 Drawing Sheets

METHOD FOR MONITORING AN RF POWER AMPLIFIER, AND AN RF DEVICE, A MONITORING DEVICE, AND AN MR SYSTEM CORRESPONDING THERETO

BACKGROUND OF THE INVENTION

1. Field of the Invention

The present invention concerns a method for monitoring a radio frequency power amplifier, as well as a corresponding radio-frequency device, a corresponding radio-frequency monitoring device and a corresponding magnetic resonance tomography system.

2. Description of the Prior Art

Magnetic resonance tomography is an imaging modality now in widespread use, which is based on the detection of signals arising from precessing nuclear spins of protons in a body region of an examination subject. First, a strong, stable homogenous magnetic field is generated in which the body region is disposed, which causes a stable alignment of the protons in the body region. This stable alignment is altered by radiating electromagnetic radio frequency energy into the region. After this excitation the magnetic resonance signals created in the body are detected with suitable receiver coils. The signals are processed are processed and an image of the tissue in this body region is reconstructed therefrom, with which a medical diagnosis can be made, or a surgical procedure can be planned or guided.

A magnetic resonance tomography system has a number of interacting components, each of which requires the use of modern and elaborate technologies. A central component of a magnetic resonance tomography system is the radio frequency device. This is responsible for the generation of the radio frequency pulses that are radiated into the body region to be imaged. The radio frequency pulses at the output of a radio frequency power amplifier of a magnetic resonance tomography system are conducted via a measurement device to a transmission coil that radiates the radio frequency pulses into the body region. As used herein "transmission coil", means any antenna device with which the radio frequency pulses can be radiated.

With the development and establishment of magnetic resonance tomography systems, limit values to ensure patient safety have been standardized that regulate the maximum permissible radio frequency irradiation into a human body. A typical limit value for this is the maximum allowable SAR value (SAR=specific absorption rate).

To abide by these limit values, in the measurement device cited above, measurement values are recorded that represent the power of the radio frequency pulses radiated by the transmission coil. Control values are formed on the basis of a number of such measurement values. These control values are then compared with a fixed threshold (limit control value) that is predetermined by a standard, and the radio frequency power amplifier is automatically limited in operation (usually deactivated) if and when a control value exceeds the predetermined threshold.

The maximum radio frequency power that the patient safely tolerates—without health impairment—is dependent on, among other things, different environmental parameters. In particular, a direct relation exists between the maximum radio frequency power and climate values, for example the temperature and/or the humidity of the immediate environment of the patient. For this reason, new guidelines for the SAR monitoring require adaptation of the SAR limit values to the climate values of the environment of the patient. However, since the temperatures in the examination region change continuously, the limit values would then have to be correspondingly continuously adapted during a running data acquisition.

In conventional monitoring, an average value of the radio frequency power radiated in the appertaining time window is determined based on the sum of a number of values measured in a preceding time window. In particular in connection with magnetic resonance tomography systems, such a value is a good measure for the total radiation exposure to which an irradiated person has been exposed in the previous time window. This power average is then compared with a fixed limit value for the appertaining, retroactive limit value. A simple monitoring of the adherence to the limit values is possible in this manner.

For limit values that continuously change, however, such an inflexible monitoring concept is no longer suitable. The problem is that, as soon as a new limit value is determined in the examination space (for example based on a temperature and/or humidity measurement), this limit value must assumed to have been effective for a past time window in order to be able to ensure complete safety. In practice, in conventional methods this would necessitate the radio frequency power amplifier always having to be deactivated when, for example, the limit value is decreased due to a temperature increase. This can be explained in a simple example: Assume that, given a temperature of 25° C. and 60% humidity, the maximum limit value for the radio frequency power is at 4 W/kg of body weight of the patient at a first point in time t1. Furthermore, assume that for the current time period this power limit value is used and the power is radiated in the extreme case up to 4 W/kg. It should be noted that generally it is reasonable to operate the system with an optimally high radio frequency power within the allowable safety limit values, since this leads to a higher dynamic range and consequently to an improvement in the quality of the generated exposures. At a subsequent measurement point in time t2, it is then established that a temperature of 33° C. exists with 60% humidity. The maximum allowable power value is then only 2 W/kg. However, since a limit value of 4 W/kg has been assumed in the time span between the first measurement at point in time t1 and the second measurement point in time t2, the probability is very high that this limit value has already been exceeded at the point in time t2 of the determination of the new limit value. Therefore, the apparatus would have to be deactivated immediately due to this retroactive consideration. Thus with conventional methods, it is usually not possible to monitor a number of measurements in succession with constantly changing (for example, due to changing environment parameters) limit values.

SUMMARY OF THE INVENTION

It is an object of the present invention to provide a method and associated components and systems monitoring a radio frequency power amplifier that safely prevent an excess of radiated radio frequency power above a temporally varying threshold, while enabling a continual measurement without repeated shutdowns (deactivations) of the power amplifier.

The invention is based on, among other things, the above-described recognition that conventional methods for monitoring a radio frequency power amplifier frequently leads to undesirable deactivations of the radio frequency power amplifier due to the typical retroactive effect, in which a power average determined over a preceding time window is compared with the power limit value that effective for the current time window.

Based on this recognition, in accordance with the invention repeated measurements are mode of values that represent the power of the radio frequency pulses emitted by a radio frequency power amplifier via a transmission coil. Moreover, the temporally variable power limit values are determined at temporal intervals. Based on a number of measurement values measured in a preceding time window, a control value is then determined representing a radio frequency dose emitted in the appertaining time window. A limit control value that represents a dose limit value allowed in the appertaining time window is likewise based on a number of power limit values determined in the predetermined time window. Finally, the radio frequency power amplifier is limited in operation if and when the control value reaches or exceeds the limit control value.

Thus both the measurement values and the power limit values determined within this time window are considered in parallel within a time window, and a control value corresponding to the dose is determined for these appertaining values, this control value then being available for comparison. The control value that is acquired based on the measurement values can be, for example, an integration of the measurement values and the limit control value of the integration of the power limit values in the appertaining time window. In this manner, it is possible also to simultaneously observe the power limit value curve in addition to the measurement value curve. An exact monitoring of the curve of the proportionate attainment of the respective allowable limit value by the measurement quantity thus also ensues given arbitrary changes of the power limit value within a time window. This means that, at the end of each time window under consideration—in contrast to the known methods—it is ensured that the power radiated in the past time window has not already exceeded the power limit value allowed in the appertaining time window, and thus the apparatus does not have to be immediately deactivated.

Limitation of the operation of the radio frequency power amplifier can ensue in the inventive method, for example by shutting off the radio frequency power amplifier, temporarily deactivating the radio frequency power amplifier, or reducing the transmission power of the radio frequency power amplifier.

Given the use of the invention in a magnetic resonance tomography system, the radio frequency exposure should be primarily monitored for the patient. It is therefore reasonable to use measurement values that represent the power supplied to the transmission coil or the power radiated by the transmission coil. The measurement values therefore preferably are difference between the delivery power delivered to the transmission coil by the radio frequency amplifier and the return power returning from the transmission coil.

However, since measurement of the power of the radio frequency pulses emitted by the radio frequency amplifier also indirectly represents the power returned by the transmission coil, in principle only the power emitted by the radio frequency amplifier or a corresponding measurement value could be used in a simpler exemplary embodiment.

The temporal interval between the radio frequency pulses and the temporal interval between the measurements can be the same or different.

In principle, it is possible to determine a power limit value effective at this point in time given the measurement of each individual measurement value. For this purpose, for example, both the measurement values and the power limit values can be determined in the same time period. This procedure has the advantage that the control value can be simply formed from the sum of the individual measurement values and the limit control value and the sum of the corresponding power limit values in the respective time window to be monitored. This means that the sums of the measurement values and the power limit values can be directly compared.

However, the power limit values do not necessary have to be obtained in the same time window as the measurement values. Each time window can in principle can be independent of the other. Thus, for example, the measurement values can be measured much more frequently than new power limit values are determined. In particular, it is also not necessary that the temporal intervals, in which the power limit values are determined and the measurement values are measured, be constant. For example, the measurement of the measurement values or the determination of the power limit values do not have to ensue in a fixed time period.

In order to be able to operate independently of each time window, the control value is based on the sum of a number of measurement values that are respectively weighted with an interval length between the measurement of two successive measurement values. This means that, for example, a measurement value is multiplied by the interval length between the preceding measurement and the appertaining measurement. In this manner, the measurement values are surface-integrated into the time window to be monitored. In the same manner, the limit control value preferably also is based on the sum of a number of power limit values (respectively weighted with an interval length between the determination of two successive power limit values), such that here as well a corresponding surface integral is formed. The advantage of this method is that, for a consideration of the integrals, it is insignificant how coarsely or finely the measurement values or the power limit values are graduated. The control value or limit control value determined with the integration is always correct, and the limit control value determined in the appertaining time window can be directly compared with the appertaining control value.

The power limit values preferably are determined dependent on an environment temperature in proximity to the examination subject, in particular given the application of the invention in a magnetic resonance tomography system, i.e. given use of the radio frequency pulses for magnetic resonance examination of an examination subject. For this purpose, a temperature sensor is necessary at a suitable position in proximity to the examination subject, for example on or in the tomography scanner. The power limit value can then be determined dependent on this environment temperature, for example by means of a linear equation. The selected linear equation also can depend on further environment parameters such as, for example, the current humidity. It is likewise possible to provide specific power limit values i a table (look-up table) for specific environment temperatures and/or specific humidity values and/or other environment parameters. Furthermore, it is not necessary that the power limit values be linearly associated with the environment parameters or constantly vary with the variations of the environment parameters, but rather a gradation of power limit values dependent on the environment parameters is possible.

Preferably one time window is used that "slides" over the measurement values. The control values used for comparison with the threshold, which are respectively based on a number of measurement values in the respective time window, thus very promptly reflect the actual radiation exposure that has occurred for a patient in the past time span, for example in a magnetic resonance tomography system.

In a preferred exemplary embodiment, monitoring of the radio frequency power ensues in various nested time windows, i.e. for example a short-term monitoring and a long-term monitoring are implemented. Respective control values and associated limit control values are simultaneously determined for a number of time windows of different lengths, preferably two time windows of 10 s and 360 s. The radio frequency power amplifier is then limited in operation when only one of the control values exceeds the associated limit control value. Given the long-term monitoring, the power limit values from which the limit control value is determined for the longer time window are generally lower than the power limit values effective in the short-term monitoring, on the basis of which the limit control value is determined for the shorter time window. However, overall the limit control value for the longer time window is normally higher than the limit control value for the shorter time window. This method serves to monitor the radiation of a specific higher dose over a longer time window and to simultaneously ensure that the total power allowed within the long time window to be monitored is not radiated on a patient within a short time window, which would place the patient at risk of a short-term power excess.

The invention also concerns a radio frequency device with a radio frequency power amplifier that emits radio frequency pulses via a transmission coil, with a measurement device to measure measurement values that represent a power of the RF pulses, and with a radio frequency monitoring device as described above, coupled with the radio frequency power amplifier and the measurement device.

The radio frequency monitoring device, which can be executed as a processor device, is operated—preferably programmed—such that temporally variable; predetermined power limit values are determined in temporal intervals. A control value representing the radio frequency dose emitted in the time window is based on a number of measurement values measured in a time window. Likewise, a limit control value representing a dose limit value allowed in the appertaining time window is determined by the radio frequency monitoring device based on a number of power limit values determined in the appertaining time window. The radio frequency power amplifier is limited in operation if and when a control value reaches or exceeds the associated limit control value.

The present invention also concerns a radio frequency monitoring device having a measurement value input for measurement values and a monitoring signal output for monitoring signals. The radio frequency monitoring device is configured such that temporally variable, predetermined power values are determined at temporal intervals. Moreover, a control value representing the radio frequency dose emitted in the appertaining time window is determined by the radio frequency monitoring device based on a number of measurement values measured in a time window, these measurement values representing the power of the radio frequency pulses emitted by a radio frequency power amplifier, and a limit control value representing a dose limit value allowed in the appertaining time window is determined based on a number of power limit values determined in the appertaining time window. A monitoring signal that effects the limitation of the operation of the radio frequency power amplifier is output to the monitoring device when a control value reaches or exceeds a predetermined limit control value.

The measured limit values can be supplied in their original form or in a predetermined form, i.e. for example after an analog-digital conversion and/or a conversion of effective RMS voltages in the difference between delivery power and return power.

In addition, the invention concerns a magnetic resonance tomography system that includes the radio frequency device specified above. In addition, the magnetic resonance tomography system has all further typical components such as, for example, a magnet system to generate a basic magnetic field, a gradient system with a number of gradient coils to apply magnetic field gradients, a radio frequency transmission system with transmission coils, a radio frequency reception system with reception coils, a suitable reception amplifier, and an image computer. For example, the transmission coils can also serve as reception coils.

DESCRIPTION OF THE PREFERRED EMBODIMENTS

Figure 1:
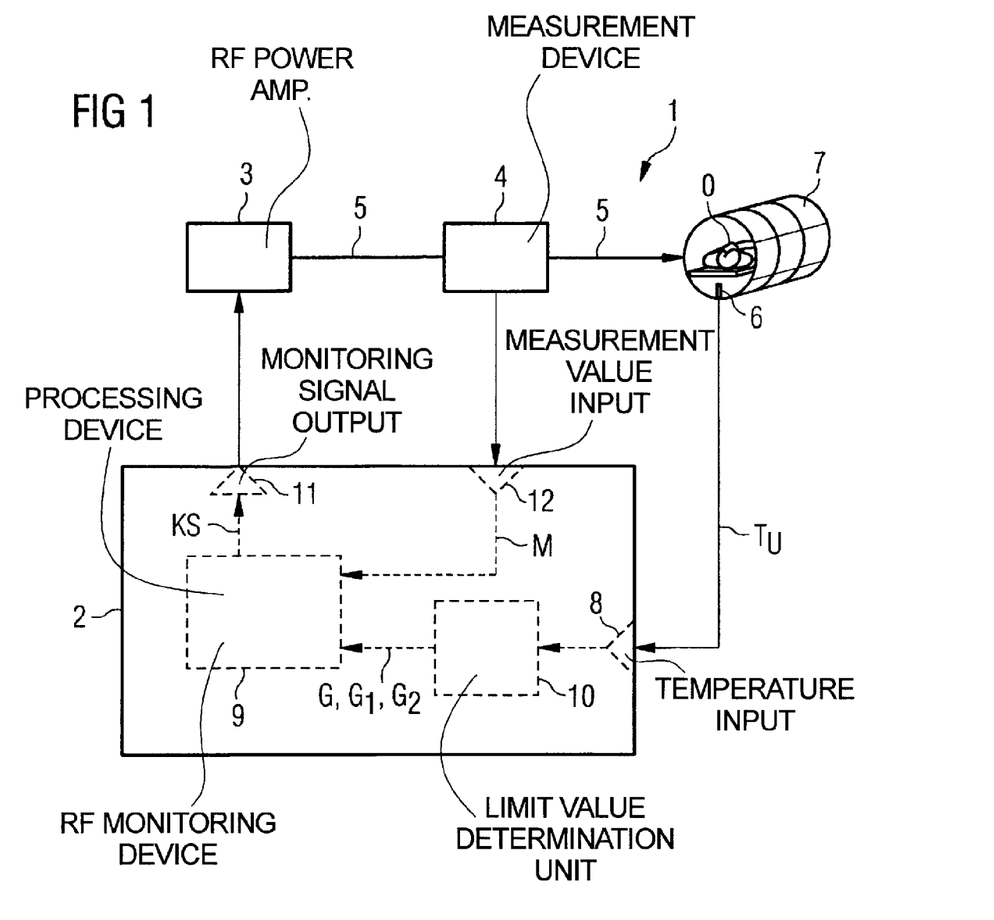
FIG. 1 schematically illustrates an inventive radio frequency device for a magnetic resonance tomography system.

As a basic component of a magnetic resonance tomography system, FIG. 1 shows a radio frequency device 1. The representation shown in FIG. 1 concentrates on the transmission branch of the radio frequency device 1.

In addition to the transmission branch of the radio frequency device 1, the magnetic resonance tomography system has a magnet system (not shown) for generation of a basic magnetic field in which at least a part of a patient is disposed during an examination, as well as gradient coils (not shown) to apply magnetic gradient fields. Moreover, a radio frequency reception system (not shown) is provided, with a reception coil and a suitable reception amplifier. The transmission coil can also form the reception coil. An image computer (not shown) reconstructs images from the received signals for display, for example on a screen, and/or for storage in a memory. A control computer (not shown) serves for coordination of the interaction of the individual components.

The radio frequency device 1 includes a radio frequency power amplifier 3 that emits radio frequency pulses H preferably in a power range between 10 W and 20 kW. The radio frequency pulses H are conducted via a transmission cable 5 to a measurement device 4. From the measurement device 4, the radio frequency pulses are conducted to a transmission coil 7 that radiates the radio frequency pulses into the body region of a patient O.

The measurement device 4 is shown in the exemplary embodiment as a sensor, in particular a transmit antenna level sensor (TALES), and has directional couplers to decouple a small part of the delivery power delivered by the radio frequency amplifier 3 to the transmission coil 7 and a small part of the return power returning from the transmission coil 7, which are then respectively converted into voltages. The radio frequency voltage measured in this manner can be between 0 and 1000 volts.

The measured values, if applicable, are supplied by the measurement device 4 to a radio frequency monitoring device 2 via a measurement value input 12 after an analog-digital conversion and/or other pre-processing. The radio frequency monitoring device 2 includes a processing device 9 together with a digital signal processor.

In specific time intervals, for example in the interval of 20 μs, the measured voltage values are converted into the resulting power remaining in the transmission coil 7 of the magnetic resonance tomography apparatus, by subtracting the return power from the incoming power, i.e. the delivered power. This means that a measurement value M for the radio frequency monitoring device 2 is detected at fixed time intervals of 20 μs. This pre-processing of the voltage values in the actual desired measurement values M can ensue, for example, in the measurement device 4, at the measurement value input 12 or only in the processing device 9.

The processing device 9 is operated (in programming, for example) to form control values K on the basis of the measurement values M, and to compare these control values K with limit control values GK, $GK_1$, $GK_2$. If a control value K exceeds an associated limit control value GK, $GK_1$, $GK_2$, a monitoring signal KS that causes at least a temporary deactivation of the radio frequency power amplifier 3 is emitted at a monitoring signal output 11 of the radio frequency monitoring device 2.

To determine the limit control values GK, $GK_1$, $GK_2$, at a second input the processing device 9 receives, at specific temporal intervals, respective current power limit values G, $G_1$, $G_2$ that can change over time. These power limit values G, $G_1$, $G_2$ are dependent on the environment temperature $T_U$ in the proximity of the patient O in the magnetic resonance tomography apparatus. A temperature sensor 6 that measures the current temperature $T_U$ and supplies it to a temperature input 8 of the radio frequency monitoring device 2 is located in the proximity of the patient O. The current temperature $T_U$ is then converted, in a limit value determination unit 10, into the current effective power limit value G, $G_1$, $G_2$. As soon as the limit value G, $G_1$, $G_2$ has changed by a specific amount, a new limit value G, $G_1$, $G_2$ is forwarded to the processing device 9.

The limit value determination unit 10 can determine the respectively valid power limit value G, $G_1$, $G_2$ using a simple linear equation based on the temperature $T_U$.

Figure 4:
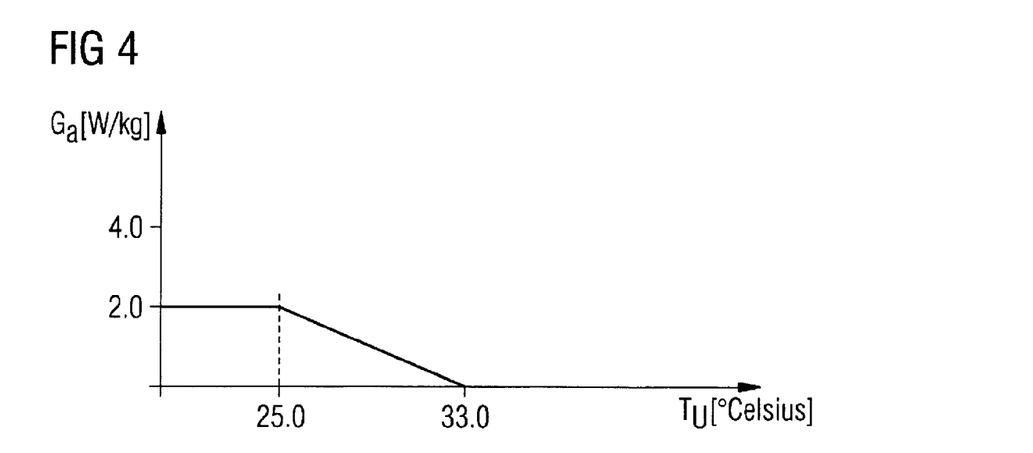
FIG. 4 shows the relation of the allowable power limit value dependent on the environment temperature of a magnetic resonance system for a normal operating mode.
Figure 5:
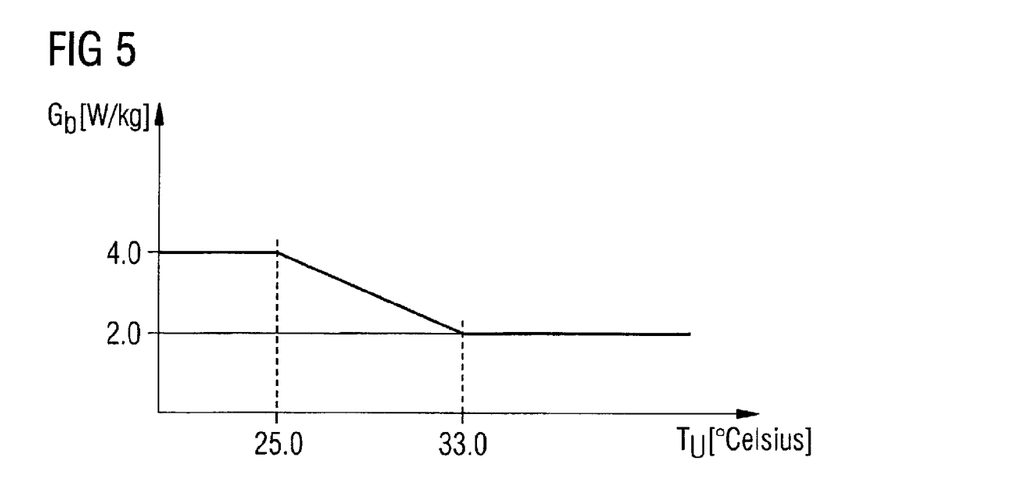
FIG. 5 shows the relation of the allowable power limit value dependent on the environment temperature in the operating mode of the first stage.

The dependency of the power limit value on the environment temperature $T_U$ is shown in FIGS. 4 and 5. FIG. 4 shows a limit value $G_a$ for the normal operating mode of the magnetic resonance tomography apparatus and FIG. 5 shows a limit value $G_b$ for an operating mode of the first stage. The maximum (dose) power is specified in Watts per kilogram of body weight of the patient over the environment (ambient) temperature $T_U$ in degrees Celsius. In the normal operating mode, an MTRA (medical-technical radiology assistant) implements a measurement without a physician attending. In the operating mode of the first stage, the limit values are higher. According to law, this operating mode is therefore allowable only when a doctor is present at the measurement.

Figure 2:
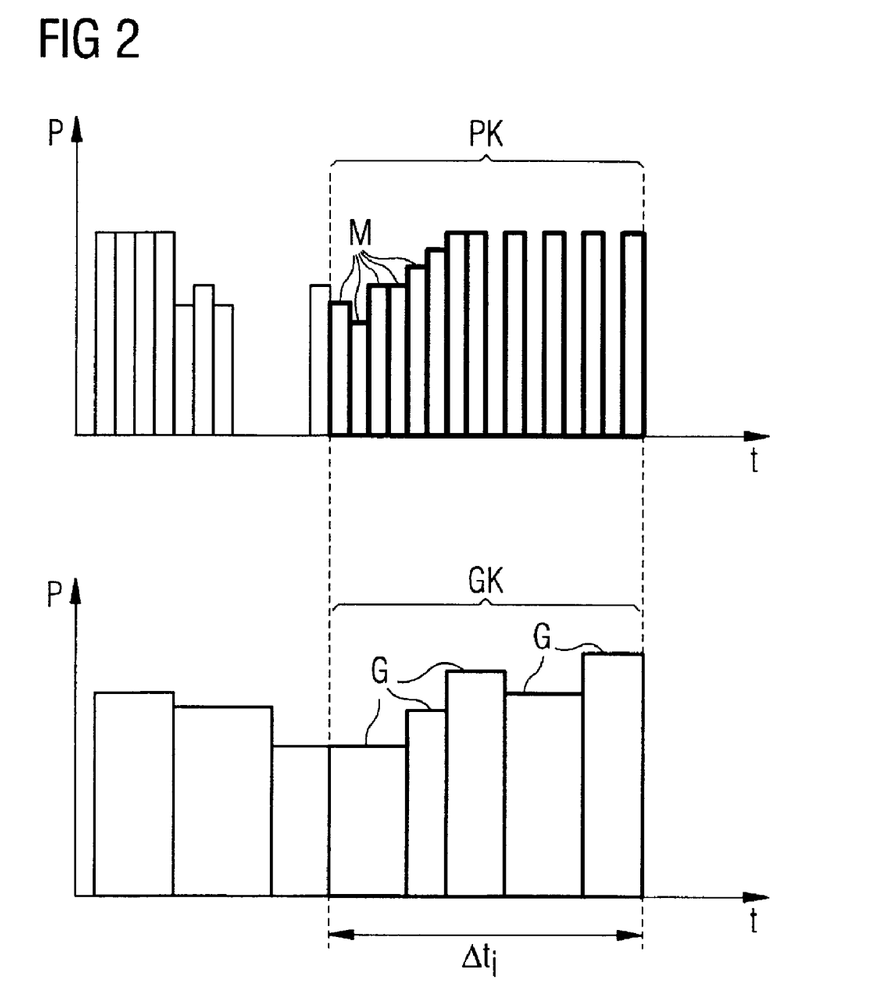
FIG. 2 shows a comparison of the measurement values measured in a specific time window and the power limit values determined in this time window for explaining of the inventive method.

In the processing device 9, the measurement values M and the power limit values G, $G_1$, $G_2$ are integrated over a time window $\Delta t_i$ of defined length, as shown in FIG. 2. The upper diagram in FIG. 2 shows the measured power P over time t, with the individual measurement values M being respectively measured at fixed time intervals, for example at intervals of 20 μs. Naturally, these time intervals can be arbitrarily selected and do not necessarily have to be uniform. The time window $\Delta t_i$ is not fixed, but rather slide with respect to time t over the measurement values M, i.e. the time window $\Delta t_i$ is, for example, incrementally shifted by one measurement value with each measurement of a new measurement value M, such that the new measurement value is obtained in the shifted window.

As can be discerned from the upper diagram of FIG. 2, the radiated power can change very significantly and very quickly, independently of whether a pulse sequence is radiated or whether, for example, a measurement pause is represented in the leading region (not included in the current time window $\Delta t_i$) of the upper diagram. Short-term transmission pauses under 20 μs are respectively contained in the current time window $\Delta t_i$.

The surface integral is then calculated by the processing device 9 over the individual measurement values M in the current time window $\Delta t_i$ as a control value PK, i.e. the measurement values M are respectively multiplied and added with the interval lengths, here the interval length of 20 μs.

In the same manner, the power limit values G determined in the current time window $\Delta t_i$ are respectively multiplied with the interval lengths between the determination of two successive new power limit values G and the surface integral is determined in the time window $\Delta t_i$ under consideration. This surface integral corresponds to the limit control value GK.

Differently from the determination of the measurement values M, the determination of the power limit values G by the processing device 9 does not ensue in a fixed time period, but rather only when the power limit value G has changed, for example due to larger temperature variations. However, since overall only the integration of the measurement values and the integration of the power limit values are compared in the time window $\Delta t_i$, the time period used—or whether it is a regular or irregular determination of new measurement values or power limit values—plays no role whatsoever.

In the processing device 9, only the control value GK determined by the integration of the power limit values is then still compared with the control value PK determined by the integration of the measurement values. If and when the control value PK exceeds the limit control value PK, a corresponding monitoring signal KS is emitted by the processing device 9 at the output 11 of the radio frequency monitoring device 2, and therewith the power amplifier 3 is temporarily deactivated.

On average a patient tolerates a different power over a longer time span than over a shorter time span. Thus, for example, it must be ensured that the entire maximum power allowed within a longer time window under consideration (which, for example, can encompass an entire measurement of a number of minutes) is radiated within a shorter time window. Therefore a short-term monitoring and a long-term monitoring preferably are implemented in parallel.

Figure 3:
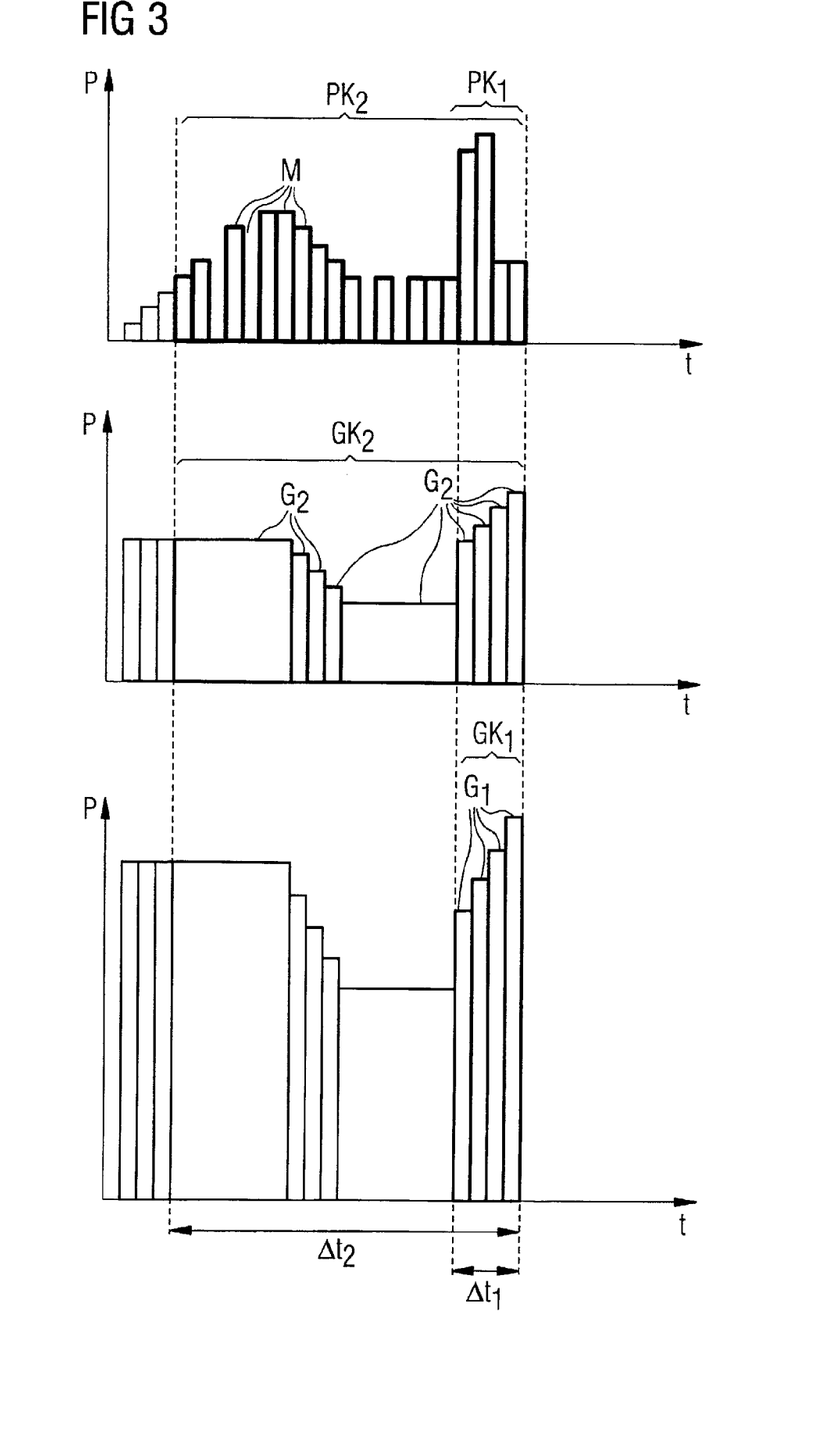
FIG. 3 shows a comparison of the measured measurement values and the determined power limit values similar to FIG. 2, but for two nested time windows of different lengths.

This principle is shown in FIG. 3. Here a longer time window $\Delta t_2$ of, for example, 6 minutes and a short time window $\Delta t_1$ of, for example, 10 seconds are monitored. Both time windows $\Delta t_1$, $\Delta t_2$ slide over the measurement values M in the time range, i.e. with respect to time t.

From the basic principle, this method functions just like the previous simple method specified using FIG. 2. In contrast to this simple method, however, not just one power limit value G is regularly determined and observed within the considered time window. Instead, two power limit values $G_1$, $G_2$ are determined in parallel. The first power limit value $G_1$ applies for the short-term observation and the second power limit value $G_2$ applies for the long-term observation. The short-term power limit value $G_1$ can amount to approximately triple the long-term power limit value $G_2$.

As shown in FIG. 3, the processing device 9 must now determine a long-term limit control value $GK_2$ for the longer time window $\Delta t_2$ (of, for example, 360 s) using the power limit values $G_2$ determined in this time window $\Delta t_2$ and with the aid of the already-described integration method. Moreover, it must determine a short-term limit control value $GK_1$ in an analogous manner for the shorter time window $\Delta t_1$ (of, for example 10 s) using the valid short-term power limit values $G_1$. In parallel with this, as in the simple method the measurement values M are respectively integrated within the entire longer time window $\Delta t_2$ and thus a long-term control value $PK_2$ is determined. Moreover, the measurement values M are integrated over the past shorter time window $\Delta t_1$ in order to thus determine the short-term control value $PK_1$.

A monitoring signal KS is then emitted when either the long-term control value $PK_2$ exceeds the long-term limit control value $GK_2$ or the short-term control value $PK_1$ exceeds the short-term limit control value $GK_1$. In this manner, it is ensured that the entire allowable dose is not emitted within a short time, i.e. that the power is not momentarily too high so as to become a danger for the patient.

In order to preclude the risk of the patient being injured by ultra-short peak values that can in principle be higher than the limit value established in a very specific, short point in time, the power amplifier 3 is moreover constructed such that even ultra-short single pulses can never be high enough to harm the patient. Nevertheless, it is possible to monitor more than two time windows in parallel—for example a particularly short time window of 1 s in addition to the cited windows.

In conclusion, it is again noted that the preceding method specified in detail as well as the shown radio frequency system and the radio frequency monitoring device are exemplary embodiments that can be modified by those skilled in the art in various ways without departing from the scope of the invention. In particular, the detection of the power measurement values can ensue in a manner different than in the described manner above. Furthermore, the determination of the power limit values can ensue not only dependent on environment parameters, but also dependent on other parameters. Although the invention has been described in the preceding examples using a magnetic resonance tomography system in the medical field, the invention also can be used in other areas, such for scientific and/or industrial magnetic resonance imaging systems or, for example, in mobile radio communication or in other types of radio-based communication.

Although modifications and changes may be suggested by those skilled in the art, it is the intention of the inventor to embody within the patent warranted hereon all changes and modifications as reasonably and properly come within the scope of his contribution to the art.

We claim as our invention:

1. A method for monitoring operation of a radio frequency power amplifier that emits radio frequency pulses to a transmission coil at first temporal intervals, each of said radio frequency pulses having a power, said method comprising the steps of:

obtaining measurement values representing the power of the respective radio frequency pulses at second temporal intervals;

determining temporally varying, predetermined power limit values at third temporal intervals;

for a time window within which a number of said measurement values are measured, determining a control value representing a radio frequency dose emitted in said time window, based on said number of measurement values measured in said time window;

determining a limit control value representing a permissible dose limit value in said time window, from a number of said power limit values determined in said time window; and limiting operation of said radio frequency power amplifier if and when said control value equals or exceeds said limit control value.

2. A method as claimed in claim 1 comprising setting said first temporal intervals equal to said second temporal intervals.

3. A method as claimed in claim 1 comprising setting said second temporal intervals equal to said third temporal intervals.

4. A method as claimed in claim 1 comprising setting said first temporal intervals equal to said second temporal intervals and equal to said third temporal intervals.

5. A method as claimed in claim 1 comprising setting said first temporal intervals equal to said second temporal intervals, and wherein the step of determining said control value comprises determining said control value as a sum of said number of measurement values in said window, and wherein the step of determining said limit control value comprises determining said limit control value as a sum of said power limit values in said time window.

6. A method as claimed in claim 5 comprising formulating said sum of said number of measurement values in said time window with the respective measurement values weighted by an interval duration between successively obtaining two of said measurement values.

7. A method as claimed in claim 5 comprising formulating said sum of said number of power limit values in said windows by respectively weighting said power limit values in said window by an interval duration between successive determinations of two of said power limit values.

8. A method as claimed in claim 1 wherein said radio frequency pulses comprise a part of a pulse sequence for obtaining magnetic resonance data from an examination subject disposed in an environment exhibiting an environment parameter, and wherein the step of determining said power limit values comprises determining said power limit values in time window dependent on said environment parameter.

9. A method as claimed in claim 1 comprising obtaining said measurement values within a time range, and comprising sliding said time window over said measurement values in said time range.

10. A method as claimed in claim 1 wherein said time window is a first time window, and comprising determining said control values and said limit control values in a number of further time windows having respectively different lengths, and comprising limiting said operation of said radio frequency amplifier if any of said control values in any one of said time windows equals or exceeds the limit control value determined in said one of said time windows.

11. A method as claimed in claim 1 comprising obtaining each of said measurement values as a difference between a delivery power emitted by said radio frequency amplifier to said transmission coil, and a return power returning from said transmission coil.

12. A radio frequency device comprising:
a radio frequency power amplifier that emits radio frequency pulses to a transmission coil at first temporal intervals, each of said radio frequency pulses having a power, said method:
a measurement device that obtains measurement values representing the power of the respective radio frequency pulses at second temporal intervals; and
a monitoring device that electronically determines temporally varying, predetermined power limit values at third temporal intervals and, for a time window within which a number of said measurement values are measured, electronically determines a control value representing a radio frequency dose emitted in said time window, based on said number of measurement values measured in said time window, and electronically determines a limit control value representing a permissible dose limit value in said time window, from a number of said power limit values determined in said time window, and limits operation of said radio frequency power amplifier if and when said control value equals or exceeds said limit control value.

13. A radio frequency device as claimed in claim 12 wherein said measurement device operates with said second temporal intervals equal to said second first intervals.

14. A radio frequency device as claimed in claim 12 wherein said monitoring device operates with said third temporal intervals equal to said second temporal intervals.

15. A radio frequency device as claimed in claim 12 wherein said power amplifier, said measuring device and said monitoring device operate with said first temporal intervals, said second temporal intervals and said third temporal intervals being equal.

16. A radio frequency device as claimed in claim 12 comprising a transmission cable connecting said radio frequency power amplifier and said transmission coil, via which said radio frequency pulses are conducted, said transmission cable comprising directional couplers for respectively decoupling, from the transmission cable, a part of a delivery power to the transmission coil and a part of return power from the transmission coil, and wherein said monitoring device forms the respective measurement value as a difference between said part of said delivery power and said part of return power.

17. An arrangement for monitoring operation of a radio frequency power amplifier that emits radio frequency pulses to a transmission coil at first temporal intervals, each of said radio frequency pulses having a power, said method comprising:
a measurement device that obtains measurement values representing the power of the respective radio frequency pulses at second temporal intervals; and
a monitoring device that electronically determines temporally varying, predetermined power limit values at third temporal intervals and, for a time window within which a number of said measurement values are measured, electronically determines a control value representing a radio frequency dose emitted in said time window, based on said number of measurement values measured in said time window, and electronically determines a limit control value representing a permissible dose limit value in said time window, from a number of said power limit values determined in said time window, and limits operation of said radio frequency power amplifier if and when said control value equals or exceeds said limit control value.

18. An arrangement as claimed in claim 17 wherein said measurement device operates with said second temporal intervals equal to said second first intervals.

19. An arrangement as claimed in claim 17 wherein said monitoring device operates with said third temporal intervals equal to said second temporal intervals.

20. An arrangement as claimed in claim 17 wherein said power amplifier, said measuring device and said monitoring device operate with said first temporal intervals, said second temporal intervals and said third temporal intervals being equal.

21. A magnetic resonance tomography apparatus comprising:
a magnetic resonance scanner, adapted to interact with an examination subject therein, to acquire magnetic resonance data from the examination subject;
said magnetic resonance scanner including a radio frequency power amplifier that emits radio frequency pulses to a transmission coil at first temporal intervals, each of said radio frequency pulses having a power, said method:
a measurement device obtains measurement values representing the power of the respective radio frequency pulses at second temporal intervals; and
a monitoring device that electronically determines temporally varying, predetermined power limit values at third temporal intervals and, for a time window within which a number of said measurement values are measured, electronically determines a control value representing a radio frequency dose emitted in said time window, based on said number of measurement values measured in said time window, and electronically determines a limit control value representing a permissible dose limit value in said time window, from a number of said power limit values determined in said time window, and limits operation of said radio frequency power amplifier if and when said control value equals or exceeds said limit control value.

22. A magnetic resonance tomography apparatus as claimed in claim 21 wherein said measurement device operates with said second temporal intervals equal to said second first intervals.

23. A magnetic resonance tomography apparatus as claimed in claim 21 wherein said monitoring device operates with said third temporal intervals equal to said second temporal intervals.

24. A magnetic resonance tomography apparatus as claimed in claim 21 wherein said power amplifier, said measuring device and said monitoring device operate with said first temporal intervals, said second temporal intervals and said third temporal intervals being equal.

* * * * *